United States Patent
Girdhar

(10) Patent No.: US 9,799,763 B2
(45) Date of Patent: Oct. 24, 2017

(54) METHOD AND STRUCTURE FOR REDUCING SWITCHING POWER LOSSES

(71) Applicant: Intersil Americas LLC, Milpitas, CA (US)

(72) Inventor: Dev Alok Girdhar, Indialantic, FL (US)

(73) Assignee: INTERSIL AMERICAS LLC, Milpitas, CA (US)

( * ) Notice: Subject to any disclaimer, the term of this patent is extended or adjusted under 35 U.S.C. 154(b) by 0 days.

(21) Appl. No.: 15/052,282

(22) Filed: Feb. 24, 2016

(65) Prior Publication Data

US 2017/0062607 A1  Mar. 2, 2017

Related U.S. Application Data

(60) Provisional application No. 62/212,318, filed on Aug. 31, 2015.

(51) Int. Cl.
| | |
|---|---|
| H01L 29/78 | (2006.01) |
| H01L 29/08 | (2006.01) |
| H01L 29/66 | (2006.01) |
| H01L 29/40 | (2006.01) |
| H01L 29/423 | (2006.01) |

(Continued)

(52) U.S. Cl.
CPC ...... H01L 29/7816 (2013.01); H01L 29/0649 (2013.01); H01L 29/0865 (2013.01); H01L 29/0882 (2013.01); H01L 29/1033 (2013.01); H01L 29/1095 (2013.01); H01L 29/402 (2013.01); H01L 29/42368 (2013.01); H01L 29/66681 (2013.01)

(58) Field of Classification Search
CPC ............ H01L 29/0649; H01L 29/0865; H01L 29/0882; H01L 29/1033; H01L 29/1095; H01L 29/0402; H01L 29/42368; H01L 29/66681

See application file for complete search history.

(56) References Cited

U.S. PATENT DOCUMENTS

| | | |
|---|---|---|
| 8,492,225 B2 | 7/2013 | Girdhar et al. |
| 2011/0156810 A1 | 6/2011 | Girdhar et al. |

(Continued)

OTHER PUBLICATIONS

Alan Huang, Hard Commutation of Power MOSFET OptiMOS FD 200V/250V, Application Note AN Mar. 2014 V1.0 Mar. 2014, 7 pages.

(Continued)

*Primary Examiner* — Allen Parker
*Assistant Examiner* — Long H Le
(74) *Attorney, Agent, or Firm* — Foley & Lardner LLP; Mark J. Danielson

(57) ABSTRACT

One embodiment is directed towards a method. The method includes forming a drift region of a first conductivity type above or in a substrate. The substrate has first and second surfaces. A first insulator is formed over a first portion of the channel, and which has a first thickness. A second insulator is formed over the second portion of the channel, and which has a second thickness that is less than the first thickness. A first gate is formed over the first insulator. A second gate is formed over the second insulator. A body region of a second conductivity type is formed above or in the substrate.

6 Claims, 3 Drawing Sheets

(51) Int. Cl.
*H01L 29/10* (2006.01)
*H01L 29/06* (2006.01)

(56) References Cited

U.S. PATENT DOCUMENTS

2011/0241113 A1* 10/2011 Zuniga ................. H01L 29/402
 257/343
2015/0115361 A1* 4/2015 Su ....................... H01L 29/7816
 257/336

OTHER PUBLICATIONS

O. Haberlen, M Polzl, J. Schoiswohl, M. Rosch, S. Leomant, G. Nobauer, W. Rieger, 95% DC-DC Conversion Efficiency by Novel Trench Power MOSFET with Dual Channel Structure to cut Body Diode Losses, Proceedings of the 27th International Symposium on Power Semiconductor Devices & IC's, May 10-14, 2015, Kowloon Shangri-La, Hong Kong, 4 pages.

* cited by examiner

METHOD AND STRUCTURE FOR REDUCING SWITCHING POWER LOSSES

CROSS-REFERENCED TO RELATED APPLICATION

This application claims the benefit of provisional U.S. Patent Application Ser. No. 62/212,318 filed Aug. 31, 2015, which is incorporated herein by reference in its entirety.

It should be noted that some details of the Figures have been simplified and are drawn to facilitate understanding of the inventive embodiments rather than to maintain strict structural accuracy, detail, and scale. It should also be noted that not all semiconductor device structural elements and manufacturing steps are illustrated, as the general methods of semiconductor device designs and manufacturing are well known. It should also be noted that not all details about voltage converters are illustrated, as general designs of voltage converters are well known.

Reference will now be made in detail to the present embodiments (exemplary embodiments) of the present teachings, examples of which are illustrated in the accompanying drawings. Wherever possible, the same reference numbers will be used throughout the drawings to refer to the same or like parts.

DESCRIPTION OF THE EMBODIMENTS

Embodiments relate generally to a parallel pair of lateral transistors, e.g. metal oxide semiconductor field effect transistors (MOSFETs), which shall also be referred to as a 'composite transistor or MOSFET.' The composite transistor is capable of being used in voltage converters. In one embodiment, a composite transistor is formed on a single integrated circuit ('IC').

Figure 1:
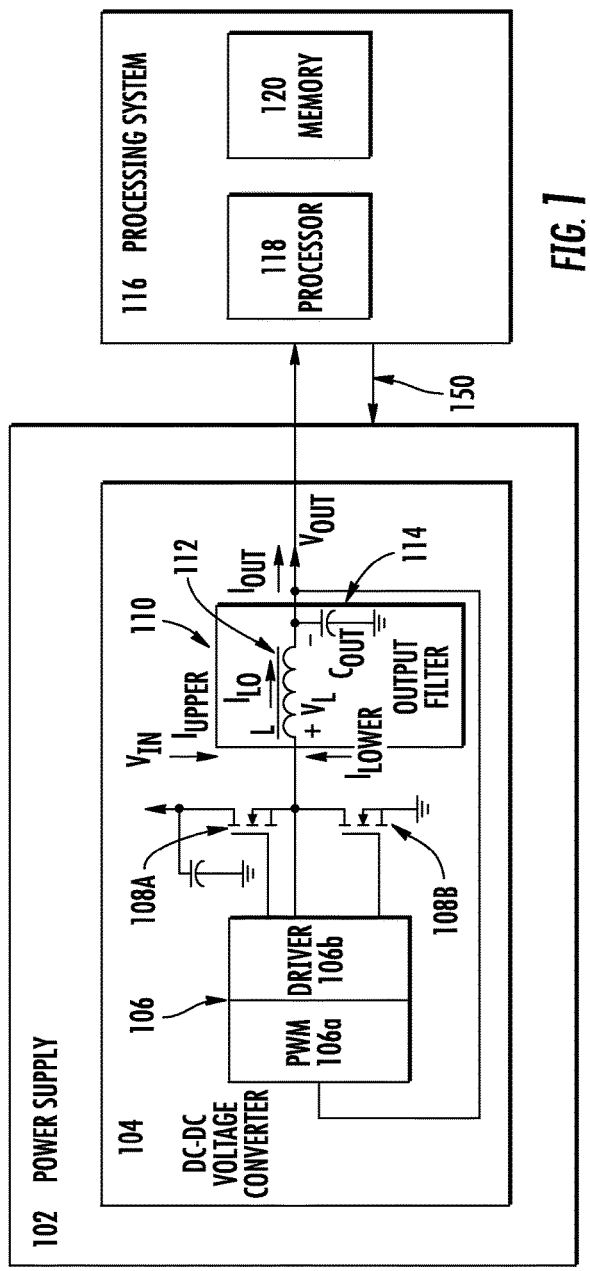
FIG. 1 is a block diagram of an embodiment of an electrical system.

FIG. 1 illustrates an exemplary electrical system 100 comprising a load, e.g. a processing system 116, and power supply 102 that includes a voltage converter, e.g. a DC-DC voltage converter 104. The processor 118 can be electrically coupled to, communicate with, and/or control the voltage converter through a data bus 150. This electrical system 100 may be a device related to telecommunications, automobiles, semiconductor test and manufacturing equipment, consumer electronics, or virtually any type of consumer, industrial electronic or other equipment.

The power supply 102 may be AC to DC power supply, or a DC supply powered by a battery. In one embodiment, the processing system 116 may include a processor 118 and memory 120 which are coupled to one another. In another embodiment, the processor 118 may be one or more microprocessors, microcontrollers, embedded processors, digital signal processors, or a combination of two or more of the foregoing. The memory 120 may be one or more volatile memories and/or non-volatile memories such as static random access memory, dynamic random access memory, read only memory, flash memory, or a combination of two or more of the foregoing. The DC-DC voltage converter 104 provides a voltage to the processing system 116 which may be more precise than a voltage provided by other voltage sources such as low drop out regulators.

In one embodiment, the DC-DC voltage converter 104 includes a pulse width modulation ('PWM') controller and driver 106, power transistors 108A, 108B, e.g. upper MOSFET and a lower MOSFET, and an output filter 110. The PWM controller and driver 106 cause the upper power transistor 108A and the lower power transistor 108B to alternatively switch on and off. In one embodiment, the PWM controller and driver 106 may include dead time control. As described in more detail below, the lower power transistor 108B advantageously is fabricated as a composite transistor. The output filter 110 may include a series inductor 112 and shunt capacitor 114.

In one embodiment, the PWM controller and driver 106 is fabricated on a single IC. Alternatively, the PWM controller 106a (PWM) and Driver 106b, which form the PWM controller and driver 106, may be formed separately, e.g. fabricated on separate ICs. In a further embodiment, the upper power transistor 108A and the lower power transistor 108B may be fabricated on a single IC. In yet another embodiment, the upper power transistor 108A and lower power transistor 108B may be fabricated on the same IC as the PWM controller and driver 106, or on the same IC as the Driver 106b.

MOSFETs have body diodes that are formed by a PN junction between the MOSFET's drift region and body region. When the upper and lower MOSFETs are turned off, the body diode of lower MOSFET is forward biased and reverse recovery charge is stored in the body diode. When the upper MOSFET is turned on, the body diode is reverse biased and reverse recovery charge flows through the body diode of both MOSFETs. Significant power is undesirably dissipated by both MOSFETs. Such power dissipation reduces the DC-DC voltage converter's efficiency. Therefore it is desirable to diminish such power loss.

Figure 2:
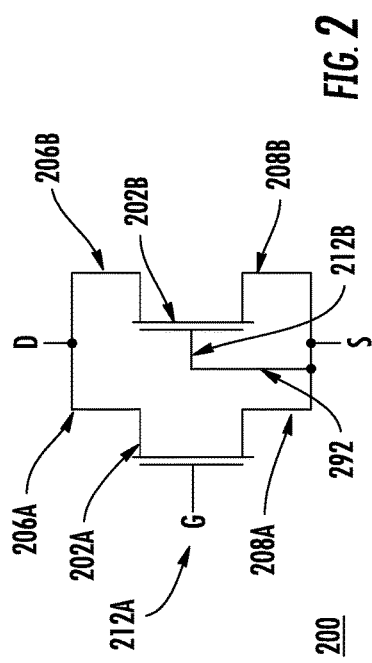
FIG. 2 is a schematic circuit diagram depicting an embodiment of a composite transistor.

Reverse recovery charge can be substantially diminished by reducing the lower MOSFET's source to drain voltage during forward conduction when both MOSFETs are off. FIG. 2 shows a schematic representation of one embodiment of a circuit to substantially eliminate losses due to reverse recovery charge. The circuit is referred to herein as a "composite MOSFET" 200 and comprises, in one embodiment, two N-type MOSFET transistors 202A and 202B. MOSFET 202A has a gate insulator that is thicker than the gate insulator of MOSFET 202B.

A gate insulator is conventionally an oxide such as aluminum oxide. Thus, embodiments using gate oxide are subsequently illustrated. However, the invention is not limited to gate oxides as other suitable insulators may be used in lieu of the oxide.

Thus, MOSFET 202A is referred to as "MOSFET with a relatively thick gate oxide." MOSFET 202B is referred to herein as "MOSFET with a relatively thin gate oxide." The MOSFET with a relatively thick gate oxide 202A has a threshold voltage, Vt, which is larger than the threshold voltage of the MOSFET with the relatively thin gate oxide 202B.

The MOSFET with a relatively thick gate oxide 202A (high Vt MOSFET) has a gate 212A, drain 206A, and source 208A. The MOSFET with a relatively thin gate oxide 202B (low Vt MOSFET) also has a gate 212B, drain 206B, and source 208B. The MOSFET with a relatively thick gate oxide 202A and the MOSFET with a relatively thin gate oxide 202B, are coupled in parallel, with the drains 206A, 206B and sources 208A, 208B respectively coupled to one another. These parallel or shunted MOSFETs 202A, 202B form the illustrated composite MOSFET 200.

As subsequently illustrated in FIG. 4, in one embodiment, the gate width of the low Vt MOSFET 202B is smaller than the gate width of the MOSFET with the relatively thick gate oxide 202A. The gate 212B of the low Vt MOSFET 202B is coupled, to the sources 208A, 208B of both MOSFETs. In one embodiment, the gate 212B and sources 208A, 208B are coupled by an interconnect 292. An example of an interconnect 292 would be a metal conductor coupled by via holes respectively to device terminal(s) and/or polysilicon connected to device terminal(s); such an interconnect 292 could be formed by metal level, via hole, and polysilicon formation steps of a semiconductor manufacturing process. Further, the foregoing composite MOSFET 200 may be readily made because modern semiconductor manufacturing processes have two gate oxides (thicker and thinner) to respectively make high and low voltage transistors, i.e. transistors with relatively high and low threshold voltages.

When the composite MOSFET 200 is used as the lower power transistor 108B in the circuit of FIG. 1, the low Vt MOSFET 202B is turned 'on' during the reverse diode recovery of the MOSFET with the relatively thick oxide 202A. The MOSFET with a relatively thick oxide 202A then has zero or almost zero drain to source voltage, eliminating or substantially eliminating reverse recovery current and corresponding reverse recovery power losses. Thus, the DC-DC converter efficiency is correspondingly increased.

Lateral MOSFETs, e.g. lateral power MOSFETs, have gates, drains and sources with surfaces that are substantially coplanar, and are parallel with at least one surface of the substrate, e.g. semiconductor wafer, upon which they are built. For this reason lateral MOSFETs may be readily formed in ICs. Because it is less expensive to form the MOSFETs on the same IC as the driver 106b, or a PWM controller and driver 106, it is desirable to also reduce losses due to reverse recovery charge in lateral power MOSFETs.

Figure 3:
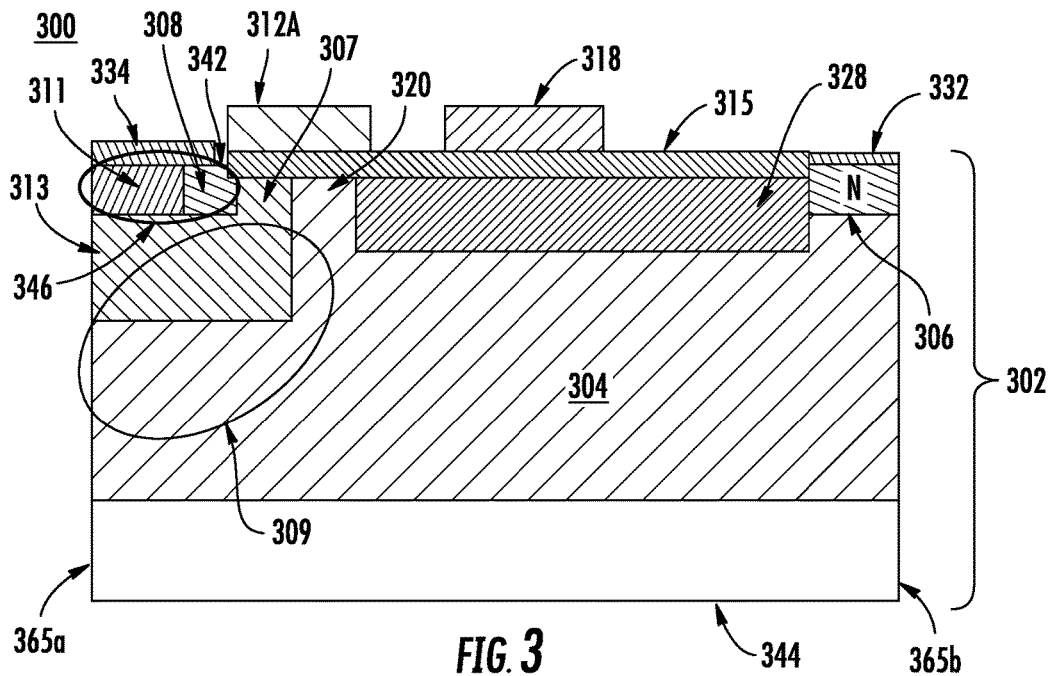
FIG. 3 is a cross section depicting an embodiment of a MOSFET having a relatively thick gate insulator.

FIG. 3 illustrates one embodiment of a cross section of a lateral MOSFET 300 with a relatively thick oxide 315 that is configured for use in a composite MOSFET such as the composite MOSFET 200 of FIG. 2 or the lower power transistor 108B of FIG. 1. The illustrated lateral MOSFET 300 is formed in a substrate 302, e.g. a semiconductor substrate, having a working surface 342 and an opposite surface 344. (The sides 365a, 365b of the substrate are deemed not to be surfaces.) In one embodiment, the substrate 302 is doped P-type. In another embodiment, the substrate is an insulator such as sapphire and the semiconductor material may be formed on or above the substrate.

An N-type drift region 304 is formed in the substrate 302. The illustrated lateral MOSFET 300 further includes an N-type source 308, an N-type drain 306, a P-type body region 313, a P-type channel 307, relatively thick gate oxide 315 overlapping the P-type channel 307, and a gate 312A over the relatively thick gate oxide 315 and P-type channel 307. The body region 313 is formed above the drift region 304. The channel 307 is formed above the body region 313. In one embodiment, the drain 306, source 308, and channel 307 are above the drift region 304, in the substrate 302, and below the working surface 342. In another embodiment, the drain 306 and source 308 are more highly doped than the drift region 304. In yet another embodiment, the gate 312A is formed by doped polysilicon (e.g. gate polysilicon). In another embodiment, the relatively thick gate oxide 315 overlaps both the channel 307 and source 308.

However, a MOSFET used in DC-DC voltage converters 104 may be more complex in design. As discussed above, the P-type body region 313 and drift region 304, having opposite doping types, form a body diode 309.

To ensure the effect of the body diode 309 is controlled, e.g. when the lateral MOSFET 300 is used in a circuit such as a DC-DC voltage converter 104, the P-type body region 313 is electrically coupled to the source 308. In the illustrated embodiment, a highly doped P-type body contact 311 provides a low resistance path to the P-type body region 313. The highly doped P-type body contact 311 and the source 308 form a contact region 346. A first silicidation 334 on the source 308 and highly doped P-type body contact 311 provides an electrical connection between these elements. In yet another embodiment, a second silicidation 332 is formed over the drain 306. Silicidation may be formed by, e.g. titanium, tungsten, platinum, or cobalt silicide.

Further, in another embodiment, the design of a lateral MOSFET 300 includes an accumulation region 320 (under the gate 312A and adjacent to the channel 307) that is doped N-type. The accumulation region 320 collects charge flowing through the channel 307. The dimensions of the accumulation region 320 are designed to provide appropriate lateral MOSFET 300 performance, e.g. breakdown voltage, maximum current flow, and parasitic resistance.

In yet another embodiment, the lateral MOSFET 300 includes an isolation region 328, in the N-type drift region 304, between the accumulation region 320 and the drain 306. In yet another embodiment, the relatively thick gate oxide 315 extends over the isolation region 328. The isolation region 328 may be formed by shallow trench isolation ('STI') or local oxidation of silicon ('LOCOS'). In yet a further embodiment, a field plate 318, e.g. formed by doped polysilicon, is deposited over the isolation region 328. In one embodiment, the field plate 318 is coupled to an electrical node. In another embodiment, the field plate 318 is electrically coupled to a node that is the N-type source 308, e.g. by doped polysilicon also known as source polysilicon. The isolation region 328 and field plate 318 are used to increase lateral MOSFET 300 breakdown voltage, and the dimensions of the isolation region and field plate 318 are designed to provide the appropriate breakdown voltage.

In one embodiment, the relatively thick gate oxide 315 extends over the channel 307, the accumulation region 320, and the isolation region 328; the relatively thick gate oxide 315 adds an additional layer of insulator to the isolation region 328. In another embodiment, the gate 312A and relatively thick gate oxide 315 also partially extend over the drain 306. In yet another embodiment, the gate 312A and relatively thick gate oxide 315 extend over the accumulation region 320. In yet another embodiment, the gate 312A extends over a portion of relatively thick gate oxide 315 over the isolation region 328.

Figure 4:
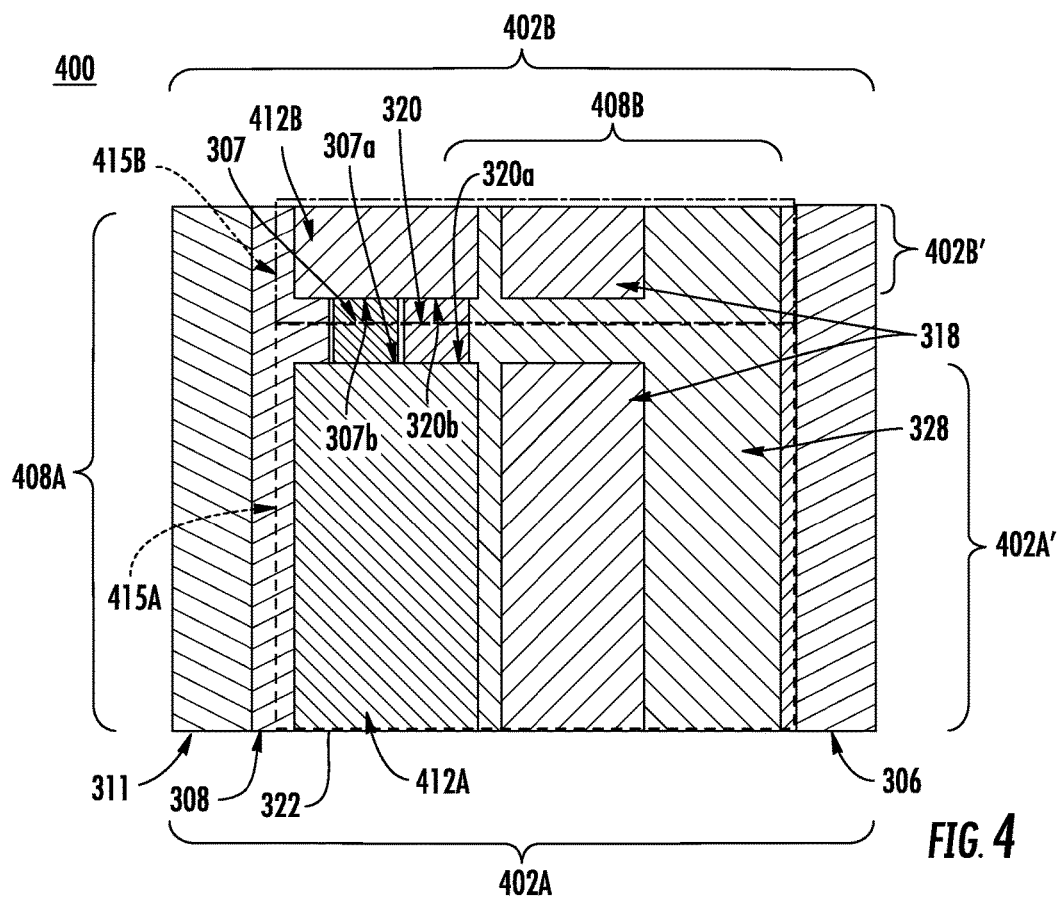
FIG. 4 is a plan view an embodiment of a composite MOSFET.

FIG. 4 illustrates an exemplary top down view (excluding silicidation) of one embodiment of a composite MOSFET 400. The first MOSFET 402A (defined by the boundaries numbered 402A and 402A') with a relatively thick gate oxide 315 and the second MOSFET 402B (defined by the boundaries numbered 402B and 402B') with a relatively thin gate oxide share a source 308, a body contact 311, a drain 306, a channel 307, an accumulation region 320, and an isolation region 328. The first MOSFET 402A has a first channel portion 307a and a first accumulation region portion 320b under the gate 412A of the first MOSFET 402A. The second MOSFET 402B has a second channel portion 307b and a second accumulation region portion 320b under the gate 412B of the second MOSFET 402B. Both MOSFETs 402A, 402B have field plates 318 formed by separate regions of source polysilicon. The first MOSFET 402A has a relatively thick gate oxide 315 deposited in the lower, larger rectangular region 415A. The second MOSFET 402B has a relatively thin gate oxide located within the upper, smaller rectangular region 415B. In one embodiment, the relatively thick gate oxide 315 has a thickness of between 120 to 180 angstroms. In another embodiment, the relatively thin gate oxide has a thickness of between 25 to 45 angstroms. In yet a further embodiment, the ratio of the relatively thick to relatively thin gate oxide thicknesses will be between 2 and 10. In another embodiment, the first MOSFET's width 402A' and second MOSFET's width 402B' range from 100 microns to ten million of microns. In one embodiment, the width of the relatively thick gate oxide 315 and the width of the relatively thin gate oxide is substantially the same as respectively the first MOSFET's width 402A' and the second MOSFET's width 402B'. In yet another embodiment, the range of ratio of the second MOSFET width 402B' to the first MOSFET width 402A' is between 5% and 100%. In another embodiment, the ratio of the relatively thick gate oxide width to the relatively thin gate oxide width is between 5% and 100%.

The first MOSFET 402A has a gate 412A, formed by gate polysilicon, over portions of the relatively thick gate oxide 315, the source 308, the channel 307, and a portion of the accumulation region 320. The second MOSFET 402B has a gate 412B formed by source polysilicon over portions of the thin gate oxide, the channel 307, the source 308, and the accumulation region 320. The source polysilicon is electrically connected to the source 308 (e.g. by an interconnect 292 as described above), and electrically couples the source 308 and gate 412B of the second MOSFET 402B.

The first MOSFET 402A and the second MOSFET 402B (and the corresponding thick and thin oxides, and gate and source polysilicon) are separated from one another; the minimum separation is determined by the design rules of the corresponding manufacturing process.

Figure 5:
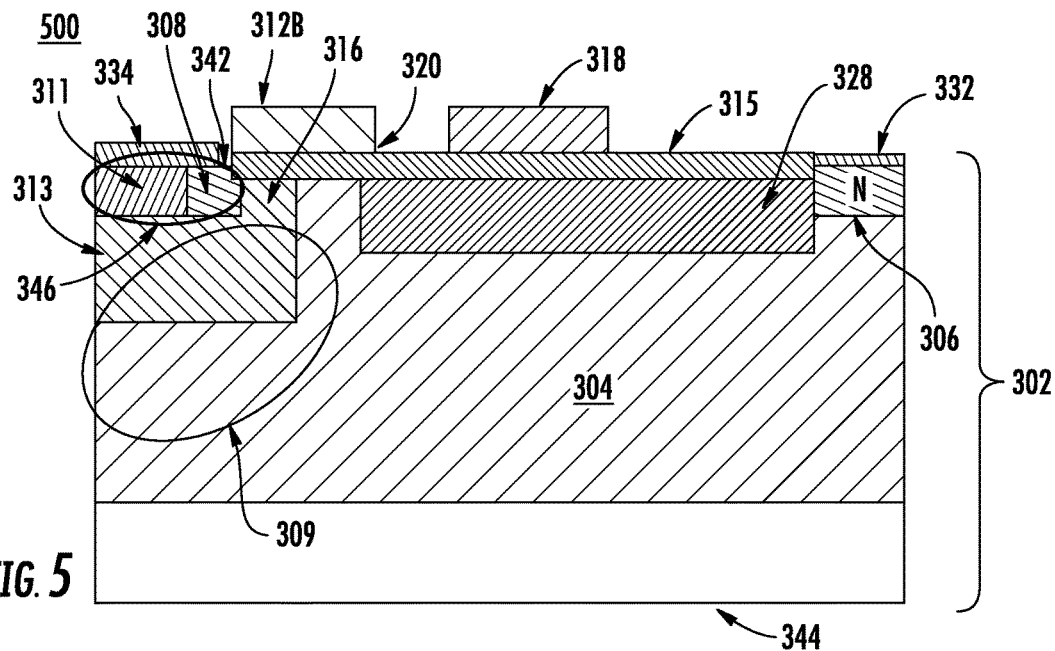
FIG. 5 is a cross section depicting an embodiment of a MOSFET having a relatively thin insulator.

FIG. 5 illustrates one embodiment of a cross section of a lateral MOSFET 500 with a relatively thin gate oxide 515 for use in a composite MOSFET. FIG. 5 is identical to FIG. 3 with the exception that a relatively thin gate oxide 515 is formed in lieu of the relatively thick gate oxide 315, and the gate 312B is formed by source polysilicon.

It will be understood that the embodiments below describe the formation of a composite MOSFET. It will also be understood that while general manufacturing information is included, semiconductor manufacturing techniques are well known and can be tailored to the specific processes being used.

Figure 6:
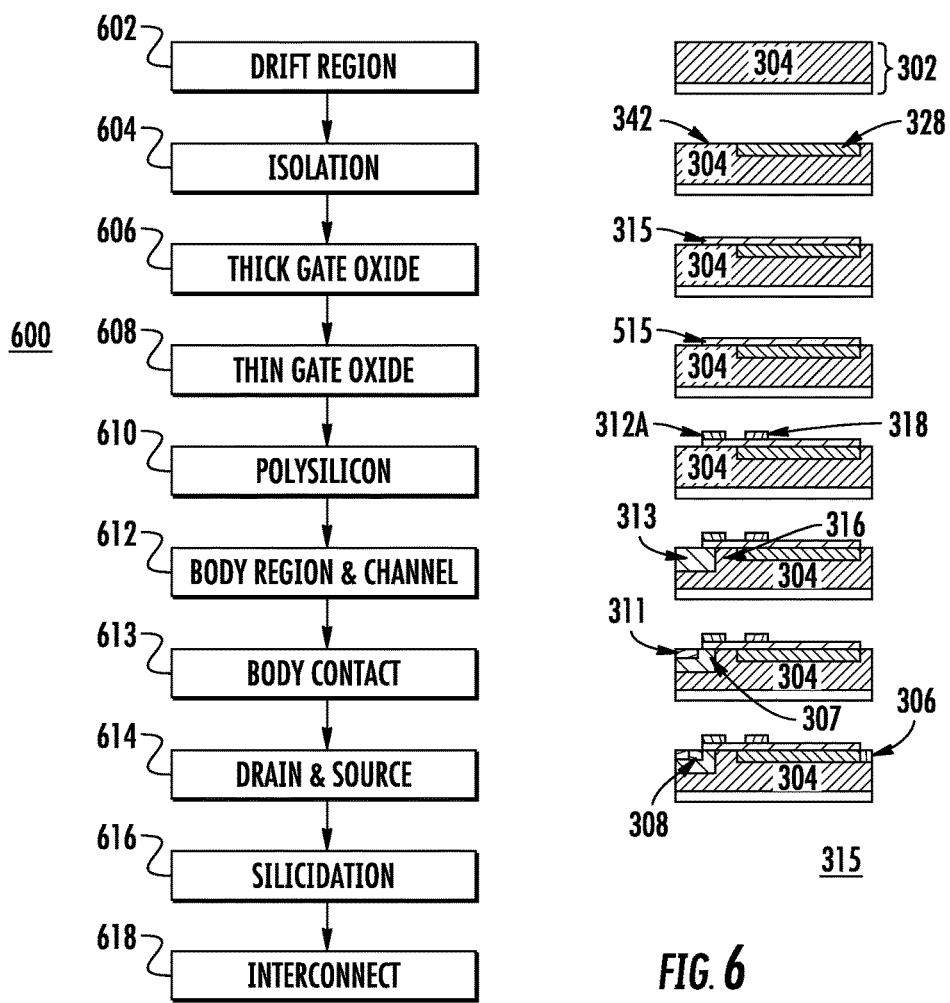
FIG. 6 illustrates an embodiment of a method of manufacturing a composite MOSFET in accordance with one or more embodiments of the present teachings.

FIG. 6 illustrates an exemplary process 600 for manufacturing the aforementioned composite MOSFET. The following embodiment describes a composite MOSFET being formed in a substrate 302.

In another embodiment the composite MOSFET could be formed on or above the substrate 302, for example, including a layer of semiconductor material. The term 'on' or 'above' does not require an element to be adjacent to the substrate. For such an embodiment, the description below would be modified to reflect formation on or above the substrate 302.

In block 602, a drift region 304 of a first conductivity type is formed in a substrate 302 of a second conductivity type.

In one embodiment, one or more portions of the drift region 304 are bounded by the working surface 342 of the substrate 302.

In optional block 604, an isolation region 328 is formed in the substrate 302, e.g. in the drift region 304, between the channel 307 and the drain 306. As previously stated, isolation region 328 may be formed by STI or LOCOS. In one embodiment, a top surface of the isolation region 328 is substantially co-planar to the working surface 342, and a top surface of channel 307, drain 306, and source 308. In yet a further embodiment, the isolation region 328 is formed so that a portion of the drift region 304, known as the accumulation region 320, remains between the channel 307 and isolation region 328. In a further embodiment, the accumulation region 320 is substantially co-planar with the top surface of drain 306, source 308, channel 307 and working surface 342.

In block 606, a relatively thick gate oxide 315 is formed over the lower rectangular region 415A including the channel 307 of the first MOSFET 402A. In one embodiment, the relatively thick gate oxide 315 overlaps both the channel 307 and source 308. In another embodiment, the lower rectangular region 415A is formed over all or a portion, e.g. first portion, of the optional isolation region 328 in the first MOSFET 402A. In block 608, a thin gate oxide 515 is formed over the upper rectangular region 415B including the channel 307 of the second MOSFET 402B. In one embodiment, the thin gate oxide 515 overlaps both the channel 307 and source 308. In another embodiment, the upper rectangular region 415B is formed over all or a portion, e.g. second portion, of the optional isolation region 328 in the second MOSFET 402B. In yet another embodiment, the first and second portions of the isolation region 328 are substantially adjacent to one another.

In block 610, polysilicon is formed over the relatively thick gate oxide 315 and thin gate oxide 515 overlying the channel 307. In one embodiment, the polysilicon formed over the relatively thick gate oxide 315 and channel 307 is gate polysilicon. In another embodiment, the polysilicon formed over the thin gate oxide 515 and channel 307 is source polysilicon. In another embodiment, additional polysilicon is formed over the isolation regions 328 of both MOSFETs 402A, 402B to create field plates 318.

In block 612, the body region 313 and the channel 307, are formed, in the substrate 302, e.g. in the drift region 304, with a second conductivity type. In one embodiment, the channel 307 may be formed after the body region 313 by a second sub-block, e.g. with ion implantation closer to the working surface 342 of the substrate 302.

In block 613, the body contact 311 is formed in the substrate 302, e.g. in the body region 313 or drift region 304, with a second conductivity type. In one embodiment, the body contact 311 is more highly doped then the body region 313 to provide a low resistance contact. In another embodiment, the body contact 311 may be partially formed with the body region 313 during block 604, and then in block 606 the body contact 311 is fully formed by further doping, e.g. with ion implantation, to increase the conductivity of the body contact 311.

In block 614, the drain 306 and source 308 are formed in the substrate 302, e.g. in the drift region 304 or body region 313, with a first conductivity type. In one embodiment, the source 308 is formed on one side of the channel 307; the drain 306 is formed on another side of the channel 307. After their formation, a top surface of each of the drain 306, source 308, and channel 307, are substantially co-planar with themselves, and parallel with at least one surface of the substrate 302. In another embodiment, the top surface of each of the drain 306, source 308, channel 307, body contact 311, are substantially co-planar, and parallel with at least one surface of the substrate 302. In yet another embodiment, the drift region 304, drain 306, source 308, body region 313, and body contact 311 are formed using ion implantation. In yet a further embodiment, epitaxial or chemical vapor phase deposition may be used to form semiconductor regions.

In block 616, silicidation is formed over the drain 306, source 308, and body contact 311. The silicidation forms an electrical connection between the source 308 and body contact 311. In block 618, an interconnect is formed by making via holes and depositing patterned metal layer(s) as was further described above.

It will be evident to one of ordinary skill in the art that the processes and resulting structures previously described can be modified to form various semiconductor device features having different patterns, widths, and/or materials using a single mask step. Exemplary methods and resulting structures are described below. Further, it is understood to those skilled in the art that the conductivity types may differ for embodiments other than those illustrated herein.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. In addition, while a particular feature of the present disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B or A and/or B, means A alone, B alone, or A and B. The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein.

The term "conformal" describes a coating material in which angles of the underlying material are preserved by the conformal material.

Terms of relative position as used in this application are defined based on a plane parallel to, or in the case of the term coplanar—the same plane as, the conventional plane or working surface of a wafer or substrate, regardless of the orientation of a device, wafer, or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate. The term "coplanar" as used in this application is defined as a plane in the same plane as the conventional plane or working surface of a device, wafer, or substrate, regardless of orientation.

The terms "about" or "substantially" indicate that the value or parameter specified may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the methods and structures disclosed herein. It is intended that the specification and examples be considered as exemplary only, with a true scope and spirit of the present teachings being indicated by the following claims.

Example Embodiments

Example 1 includes an apparatus, comprising: a substrate having two surfaces; a drift region of a first conductivity type above or in the substrate; a drain of the first conductivity type above the drift region; a source having the first conductivity type above the drift region; a body region having a second conductivity type between the drift region and the drain; a channel of the second conductivity type having first and second portions, and which is between the drain and source; a first insulator above a first portion of the channel, and having a first thickness; a second insulator above a second portion of the channel, and which has a second thickness that is less than the first thickness; a first gate above the first insulator; a second gate above the second insulator, and which is electrically coupled to the source; and wherein a top surface of each of the drain, source, and channel are substantially co-planar, and are substantially parallel with at least one surface of the substrate.

Example 2 includes the apparatus of Example 1, further comprising an isolation region having first and second portions between each channel portion and the drain.

Example 3 includes the apparatus of Example 2, further comprising at least one field plate over the isolation region.

Example 4 includes the apparatus of Example 1, further comprising an accumulation region, of the first conductivity type, between each channel portion and the drain.

Example 5 includes the apparatus of Example 1, further comprising a body contact above the body region that is electrically coupled to the source.

Example 6 includes the apparatus of Example 1, wherein the first insulator and the second insulator are respectively first and second oxides.

Example 7 includes the apparatus of Example 6, wherein the first oxide has a thickness ranging between 120 and 180 angstroms.

Example 8 includes the apparatus of Example 6 wherein the second oxide has a thickness ranging between 25 and 45 angstroms.

Example 9 includes the apparatus of Example 6 wherein a ratio of thicknesses of the first oxide to the second oxide ranges between 2 and 10.

Example 10 includes the apparatus of Example 1, wherein a ratio of widths of the first insulator and the second insulator ranges between 5 and 100.

Example 11 includes the apparatus of Example 1, further comprising a power transistor having an output coupled to the drain.

Example 12 includes the apparatus of Example 11, wherein the power transistor is a MOSFET having a MOSFET source and a MOSFET gate; and wherein the MOSFET source is the output.

Example 13 includes the apparatus of Example 12, further comprising an output filter coupled to the drain; and a driver coupled to the first gate and the MOSFET gate.

Example 14 includes the apparatus of Example 13, further comprising a PWM controller coupled to the driver.

Example 15 includes the apparatus of Example 13, further comprising a load coupled to the output filter.

Example 16 includes the apparatus of Example 14, wherein the load further comprises a processor; and a memory coupled to the processor.

Example 17 includes a system, comprising: a composite transistor, comprising: a substrate having two surfaces; a drift region of a first conductivity type above or in the substrate; a drain of the first conductivity type above the drift region; a source having the first conductivity type above the drift region; a body region having a second conductivity type between the drift region and the drain; a channel of the second conductivity type having first and second portions, and which is between the drain and source; a first insulator above the first portion of the channel, and having a first thickness; a second insulator above a second portion of the channel, and which has a second thickness that is less than the first thickness; a first gate above the first insulator; a second gate above the second insulator, and which is electrically coupled to the source; and wherein a top surface of each of the drain, source, and channel are substantially co-planar, and are substantially parallel with at least one surface of the substrate; a MOSFET having a MOSFET gate, and a MOSFET source coupled to the drain; an output filter coupled to the drain; a driver coupled to the first gate and the MOSFET gate; a PWM controller coupled to the driver; and a load coupled to the output filter.

Example 18 includes the system of Example 17, wherein the load further comprises: a processor; and a memory coupled to the processor.

Example 19 includes a method of manufacturing a semiconductor device including a channel, comprising: forming a drift region of a first conductivity type above or in a substrate; wherein the substrate has first and second surfaces; forming a first insulator over a first portion of the channel, and which has a first thickness; forming a second insulator over the second portion of the channel, and which has a second thickness that is less than the first thickness; forming a first gate over the first insulator; forming a second gate over the second insulator; forming a body region of a second conductivity type above or in the substrate; forming the channel of the second conductivity type, above or in the substrate, having first and second portions; forming a source of the first conductivity type above or in the substrate; forming a drain of the first conductivity type above or in the substrate; forming an interconnect between the second gate and the source; wherein a top surface of each of the drain, source, and channel are substantially co-planar, and substantially parallel to at least one surface of the substrate.

Example 20 includes the method of Example 19, further comprising forming an isolation region between each channel portion and the drain.

Example 21 includes the method of Example 20, further comprising forming at least one field plate over the isolation region.

Example 22 includes the method of Example 19, further comprising forming an accumulation region, of the first conductivity type, between each channel portion and the drain.

Example 23 includes the method of Example 19, further comprising forming a body contact above the body region that is electrically coupled to the source.

Example 24 includes the method of Example 19, wherein forming the first insulator over the first portion of the channel, and which has the first thickness, further comprises forming a first oxide over the first portion of the channel, and which has the first thickness; and wherein forming a second insulator over the second portion of the channel, the second insulator having the second thickness that is less than the first thickness, further comprises forming a second oxide over the second portion of the channel, the second oxide having the second thickness that is less than the first thickness.

What is claimed is:

1. A method of manufacturing a semiconductor device including a channel, comprising:
   forming a drift region of a first conductivity type above or in a substrate;
   wherein the substrate has first and second surfaces;
   forming a first insulator over a first portion of the channel, and which has a first thickness;
   forming a second insulator over the second portion of the channel, and which has a second thickness that is less than the first thickness;
   forming a first gate over the first insulator;
   forming a second gate over the second insulator;
   forming a body region of a second conductivity type above or in the substrate;
   forming the channel of the second conductivity type, above or in the substrate, having first and second portions;
   forming a source of the first conductivity type above or in the substrate;
   forming a drain of the first conductivity type above or in the substrate;
   forming an interconnect between the second gate and the source;
   wherein a top surface of each of the drain, source, and channel are substantially co-planar, and substantially parallel to at least one surface of the substrate.

2. The method of claim 1, further comprising forming an isolation region between each channel portion and the drain.

3. The method of claim 2, further comprising forming at least one field plate over the isolation region.

4. The method of claim 1, further comprising forming an accumulation region, of the first conductivity type, between each channel portion and the drain.

5. The method of claim 1, further comprising forming a body contact above the body region that is electrically coupled to the source.

6. The method of claim 1, wherein forming the first insulator over the first portion of the channel, and which has the first thickness, further comprises forming a first oxide over the first portion of the channel, and which has the first thickness; and wherein forming a second insulator over the second portion of the channel, the second insulator having the second thickness that is less than the first thickness, further comprises forming a second oxide over the second portion of the channel, the second oxide having the second thickness that is less than the first thickness.

* * * * *